(12) United States Patent
Efland et al.

(10) Patent No.: US 6,441,431 B1
(45) Date of Patent: Aug. 27, 2002

(54) LATERAL DOUBLE DIFFUSED METAL OXIDE SEMICONDUCTOR DEVICE

(75) Inventors: Taylor Efland, Richardson; Chin-Yu Tsai; Sameer Pendharkar, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/454,934

(22) Filed: Dec. 3, 1999

Related U.S. Application Data

(60) Provisional application No. 60/110,896, filed on Dec. 4, 1998.

(51) Int. Cl.$^7$ .................. H01L 29/76; H01L 29/94; H01L 31/062; H01L 31/113; H01L 31/119
(52) U.S. Cl. .................. 257/335; 257/336; 257/339
(58) Field of Search ............................. 257/328, 339, 257/409, 335, 336, 344, 408

(56) References Cited

U.S. PATENT DOCUMENTS

| | | | | |
|---|---|---|---|---|
| 5,382,536 A | * | 1/1995 | Malhi et al. | 438/283 |
| 5,801,416 A | * | 9/1998 | Choi et al. | 257/335 |
| 6,093,588 A | * | 7/2000 | De Petro et al. | 257/333 |

\* cited by examiner

*Primary Examiner*—Tom Thomas
*Assistant Examiner*—Thien F Tran
(74) *Attorney, Agent, or Firm*—W. James Brady; Frederick J. Telecky, Jr.

(57) ABSTRACT

An embodiment of the instant invention is a transistor formed on a semiconductor substrate of a first conductivity type and having an upper surface, the transistor comprising: a well region (well 204 of FIG. 1a) formed in the semiconductor substrate (layer 202 of FIG. 1a), the well region of a second conductivity type opposite that of the first conductivity type; a source region (source region 208 of FIG. 1a) formed in the well region in the semiconductor substrate, the source region of the second conductivity type; a drain region (drain 210 of FIG. 1a) formed in the semiconductor substrate and spaced away from the source region by a channel region (given by length L1+L2), the drain region of the second conductivity type; a conductive gate electrode (layer 218 of FIG. 1a) disposed over the semiconductor substrate and over the channel region; a gate insulating layer (layer 214 of FIG. 1a) disposed between the conductive gate electrode and the semiconductor substrate and having a length, the gate insulating layer comprising: a first portion of the gate insulating layer which has a first length (L1) and a first thickness; a second portion of the gate insulating layer which has a second length (L2) and a second thickness which is substantially thicker than the first thickness, the sum of the first length and the second length equalling the length of the gate insulating layer; and wherein the first portion of the gate insulating layer being situated proximate to the source region and spaced away from the drain region by the second portion of the gate insulating layer; and wherein the well region having a dopant concentration less than that of the source region and the drain region, the well region extends at least from source region towards the drain region so as to completely underlie the first portion of the gate insulating layer and to underlie at least the second portion of the gate insulating layer.

17 Claims, 3 Drawing Sheets

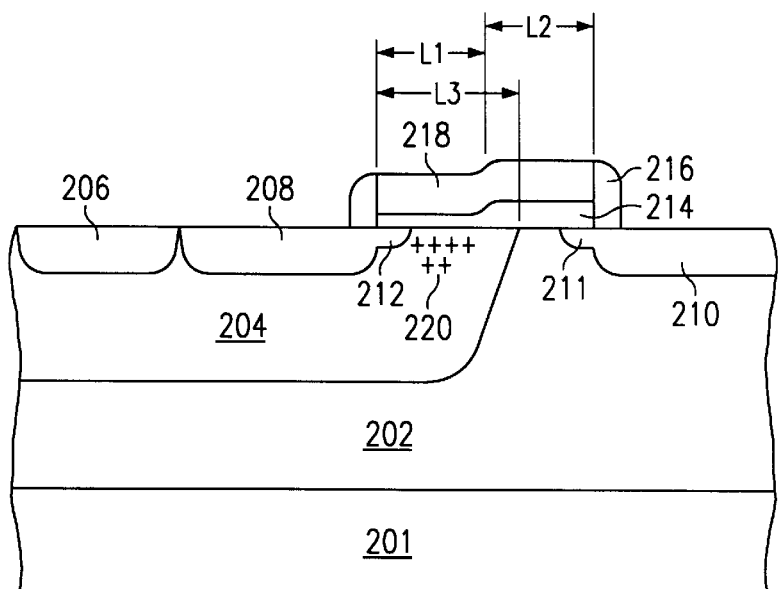
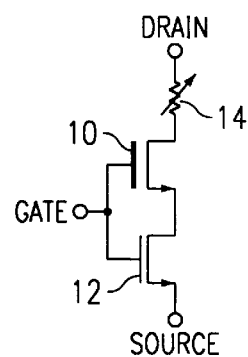
FIG. 1a
FIG. 1b
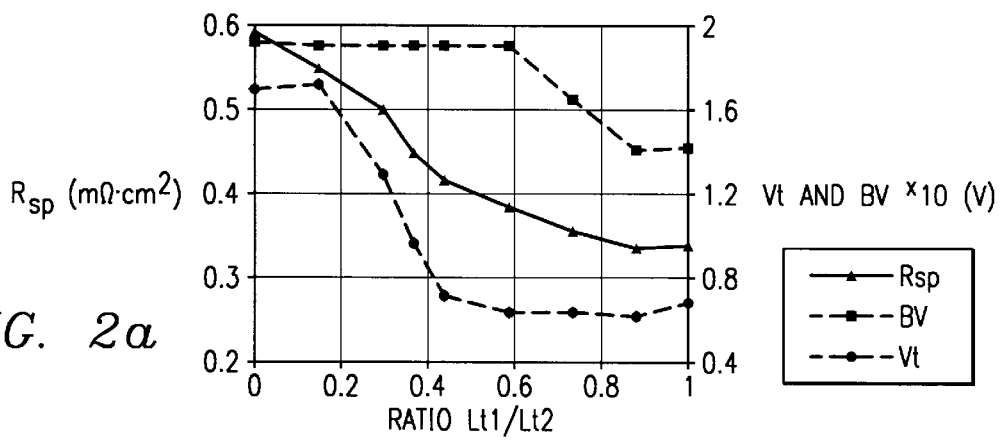
FIG. 2a
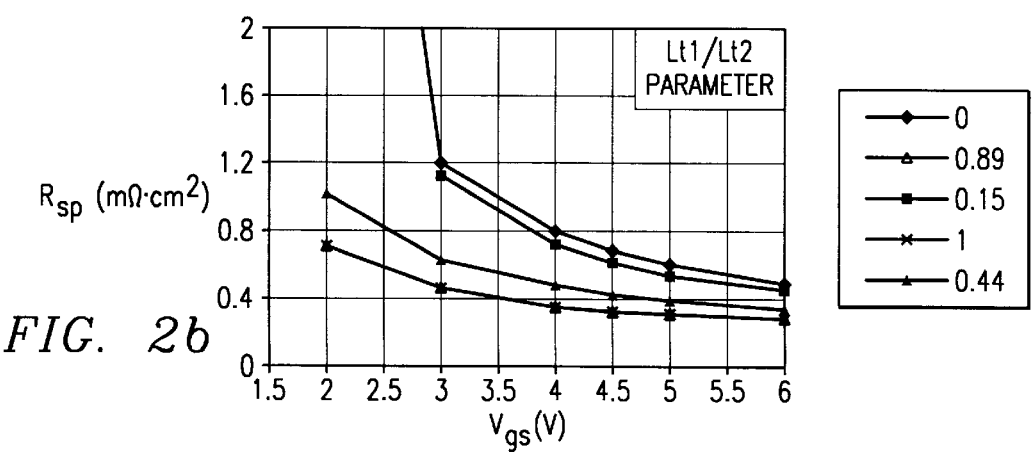
FIG. 2b

LATERAL DOUBLE DIFFUSED METAL OXIDE SEMICONDUCTOR DEVICE

This application claims priority under 35 USC §119(e)(1) of provisional application number 60/110,896 filed Dec. 4, 1998.

FIELD OF THE INVENTION

The instant invention pertains to a semiconductor device and more specifically to a lateral double diffused metal oxide semiconductor device.

BACKGROUND OF THE INVENTION

An ever present trend in semiconductor device manufacturing involves the reduction in size of devices while trying to reduce the power consumed by devices during both their "on" state and, more importantly, during their "off" state. However, while most devices on a circuit need to quite fast and they can have lower "on" state and "off" state power consumption, some devices which can handle higher powers need to be provided on the chip. For instance, a processor which needs an output which can run a small motor on a hard-disk drive or a processor which has an output that can run the windshield wiper motors on an automobile. The quicker devices, which typically consume less power, provide the computational power while the more rugged devices, which typically consume more power, supply the necessary voltage and power to run the exterior motors. In the past, the output of the processor was connected to a series of power devices, which were on a different chip, and the power devices would drive the motors. However, it is considerably less expensive and higher performance can be derived from having both the lower power, faster processing devices on the same substrate as the higher power, more rugged power devices (commonly referred to as intelligent power devices).

A problem with this technique is that it can be quite difficult to simultaneously fabricate the lower power, faster devices with the higher power, rugged devices. For instance, the gate dielectric on the lower power devices needs to be quite thin so that threshold voltage of the device remains low and the switching speed of the device remains quite fast, but in order to be able to handle the larger voltages of the higher power, the higher power devices need a thicker gate dielectric. In addition, power devices typically need a more complex series of doped regions so as to provide low resistance current paths without risking the chance of "latching up".

Another problem with the integration of logic devices with the power devices involves the voltage supplied to each of the devices. Typically, the power devices require higher supply voltages so as to properly turn the devices on and to run them efficiently. It is desirable to fabricate a power device which can efficiently supply the appropriate power needed and having a higher breakdown voltage (BV) while having lower on resistance ($R_{sp}$), lower threshold voltage ($V_T$), and faster switching times.

SUMMARY OF THE INVENTION

An embodiment of the instant invention is a transistor formed on a semiconductor substrate of a first conductivity type and having an upper surface, the transistor comprising: a well region formed in the semiconductor substrate, the well region of a second conductivity type opposite that of the first conductivity type; a source region formed in the well region in the semiconductor substrate, the source region of the second conductivity type; a drain region formed in the semiconductor substrate and spaced away from the source region by a channel region, the drain region of the second. conductivity type; a conductive gate electrode disposed over the semiconductor substrate and over the channel region; a gate insulating layer disposed between the conductive gate electrode and the semiconductor substrate and having a length, the gate insulating layer comprising: a first portion of the gate insulating layer which has a first length and a first thickness; a second portion of the gate insulating layer which has a second length and a second thickness which is substantially thicker than the first thickness, the sum of the first length and the second length equalling the length of the gate insulating layer; and wherein the first portion of the gate insulating layer being situated proximate to the source region and spaced away from the drain region by the second portion of the gate insulating layer; and wherein the well region having a dopant concentration less than that of the source region and the drain region, the well region extends at least from source region towards the drain region so as to completely underlie the first portion of the gate insulating layer and to underlie at least the second portion of the gate insulating layer. Preferably, the second thickness is around 30 to 500 nm thick (more preferably around 30 to 50 nm thick—and even more preferably around 34 to 45 nm thick). The first thickness is, preferably, around 10 to 20 nm thick (more preferably around 15 nm thick).

In an alternative embodiment, the drain region is spaced away from the well region by a second region, and dopants are introduced at a first concentration into the substrate under the first portion of the gate insulating layer and are introduced into the second region at a second concentration level which is much less than the first concentration level. Preferably, the dopants have a substantially higher concentration under the first portion of the gate insulating layer than the second portion of the gate insulating layer. In another alternative embodiment, both of the source and drain regions are formed in the well region.

Another embodiment of the instant invention is a transistor formed in a semiconductor substrate of a first conductivity type and having an upper surface, the transistor comprising: a well region formed at the upper surface of the semiconductor substrate and having a second conductivity type opposite that of the first conductivity type; a source region formed at the upper surface of the semiconductor substrate and within the well region, the source region formed of the second conductivity type and spaced from an edge of the well region by a first portion of the well region, which has a length; a drain region formed of the second conductivity type at the upper surface of the semiconductor substrates, the drain region spaced from the source region by a channel region, which has a length, and spaced from the well region by a second region, which has a length; a conductive gate structure situated over the upper surface of the semiconductor substrate and extending substantially the entire length of the channel region, the conductive gate structure having a substantially constant thickness across the conductive gate structure; a gate insulating layer situated between and abutting the upper surface of the semiconductor substrate and the conductive gate structure, the gate insulating layer comprised of: a first portion of the gate insulating layer which has a first length and a first thickness, the first portion of the gate insulating layer situated over a portion of the channel region and over a portion of the first portion of the well region; and a second portion of the gate insulating layer which as a second length and a second thickness which is substantially thicker than the first thickness, a portion of the second portion of the gate insulating layer situated over the remainder of the first portion of the well region and the remainder of the second portion of the gate insulating layer situated over the second portion; and wherein the ratio of the length of the first portion of the gate insulating layer and the length of the second portion of the gate insulating layer is around 0.4 to 0.6. The length of the channel region is, preferably, equal to the summation of the length of the first portion of the well region and the length of the second region. Preferably, the well region has a dopant concentration less than the dopant concentration of the source region or the drain region. The second thickness is, preferably, around 30 to 500 nm thick (more preferably around 30 to 50 nm thick—and more preferably around 34 to 45 run thick). Preferably, the first thickness is around 10 to 20 nm thick (more preferably around 15 nm thick).

BRIEF DESCRIPTION OF THE DRAWINGS

FIG. 1a is a cross-sectional view illustrating the device structure of one embodiment of the present invention. FIG. 1b is an equivalent circuit diagram of the transistor of FIG. 1a.

FIGS. 2a and 2b are graphs illustrating data for the device of FIG. 1. FIG. 2a is a plot of the ratio of L1/L2 versus $R_{sp}$, $V_T$, and BV. FIG. 2b is a graph illustrating $V_{gs}$ versus $R_{sp}$ for various proportions of thin gate oxide regions (L1) versus thick gate oxide regions (L2).

FIG. 5a is a graph of breakdown voltage versus L1/L2 for various gate lengths (L1+L2). FIG. 5b is a graph of $R_{sp}$ versus L1/L2 for various gate lengths. FIG. 5c is a graph of $V_T$ versus L1/L2 for various gate lengths.

Figure 3:
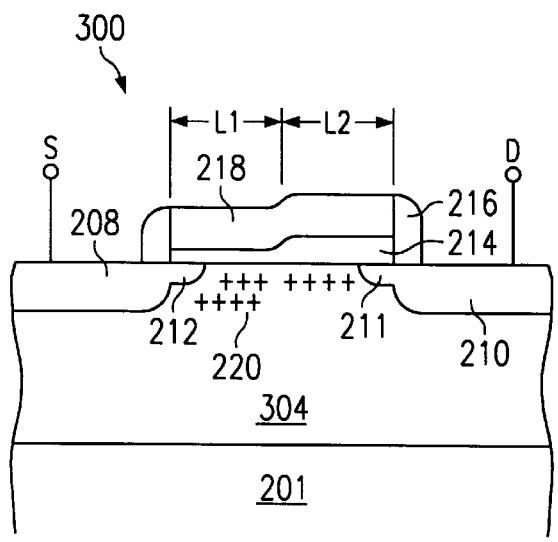
FIG. 3 is a cross-sectional view illustrating the device structure of another embodiment of the instant invention.

Common reference numerals are used throughout the following Detailed Description to designate like or equivalent features. The figures are not drawn to scale, they are merely provided for illustrative purposes to describe various aspects of the embodiments of the instant invention.

DETAILED DESCRIPTION OF THE DRAWINGS

Basically, the instant invention is a lateral double diffused metal oxide semiconductor device (LDMOS) which has a gate structure, comprised of a thin gate dielectric portion (with a length, L1) and a thick gate dielectric portion (with length, L2) situated between the substrate (or epitaxial layer situated on a substrate) and the conductive gate electrode. The device of the instant invention will have beneficial $V_{gs}$ drive performance (provided by the thin gate dielectric portion), yet have good breakdown voltage which is provided by the thicker gate dielectric portions. Device performance (specifically $R_{sp}$) is improved over traditional thick gate dielectric transistors where the ratio of L1 to L2 is around 0.4 with standard logic-type supply voltages (specifically $V_{gs}$ around 5.0 volts). Furthermore, the device of the instant invention has greater breakdown voltage as compared to standard thin gate dielectric devices.

The following descriptions of the instant invention will revolve around the devices of FIGS. 1a and 3. While these descriptions specify a certain dopant type for certain regions, one of ordinary skill in the art knows that the dopant types can be changed so as to go from an NMOS device to a PMOS device and vice versa. In addition, while a fabrication methodology is described below, any fabrication methodology may be used.

Figure 4:
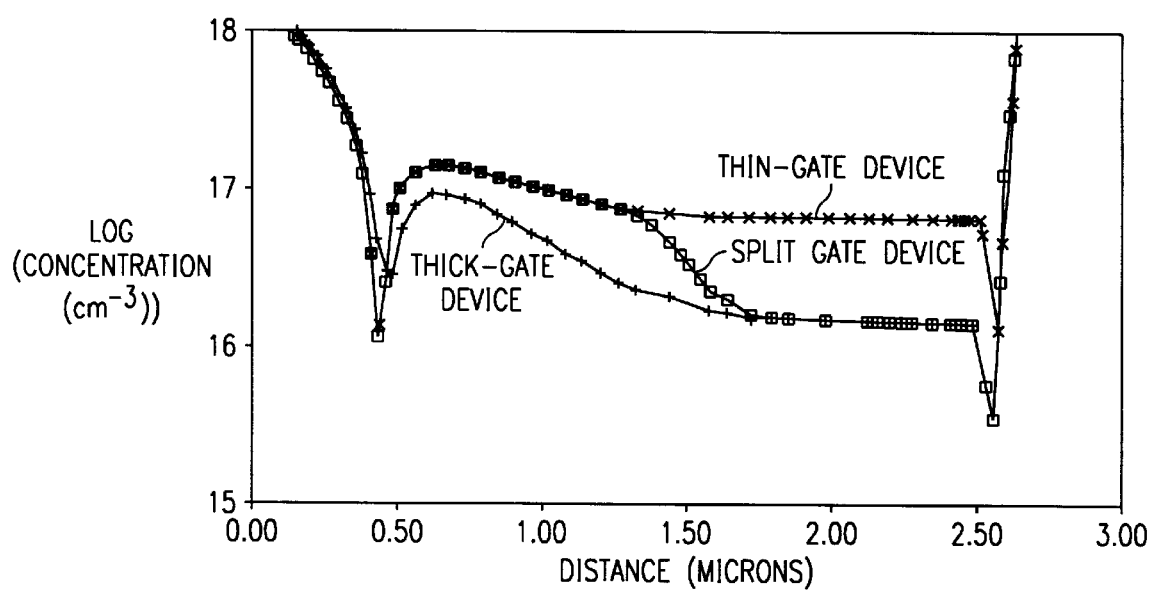
FIG. 4 is a graph illustrating dopant concentration versus distance in the substrate for thin gate dielectric, thick gate dielectric, and split-gate dielectric devices.

Referring to the embodiment of the instant invention as illustrated in FIGS. 1a and 2a–2b, layer 201 may be one layer, which is the substrate, comprised of single-crystal silicon and region 202 would be a deep well region implanted into substrate 201, or layer 201 may be comprised of single crystal silicon while layer 202 is comprised of an epitaxial silicon layer formed on the single-crystal substrate 201. If layer 202 is merely a doped region formed in substrate 201, then it, preferably, is doped with n-type dopants using a conventional blanket implantation step. However, configuring the device (as is illustrated in FIG. 1a) with layer 201 as the substrate and layer 202 as an epitaxial silicon layer may be easier because the epitaxial layer can be in-situ doped with n-type dopants as the epitaxial layer is formed. Next, Pwell 204 is formed by masking off a portion of the substrate and implanting p-type dopants into the substrate. Preferably, Pwell 204 is doped to around $1\times10^{17}$ to $1\times10^{18}$ cm$^{-3}$ with boron. An insulating layer is blanketly formed. Preferably, the insulating layer will be comprised of silicon dioxide, silicon nitride, an oxynitride stack, a high dielectric constant material (such as PZT, BST, a silicate, or tantalum pentoxide), or a combination of the above, and it will be around 15 to 30 nm thick (more preferably around 15 to 27.5 nm thick). A patterning layer is formed so that the thicker portion of gate insulator 214 is masked off along with the rest of the wafer except for the portion where the thinner portion of gate insulator 214 will be formed. Once these portions are masked off, a low-voltage $V_T$ implant is performed to form implant region 220. Preferably, the implant is accomplished using boron with a dosage around $5\times10^{11}$ to $5\times10^{12}$ cm$^{-3}$ and an energy around 20 keV. The resulting dosage of implant region 220 is preferably on the order of $1\times10^{17}$ to $5\times10^{17}$ cm$^{-3}$. As is shown in FIG. 1a, dopants 220, preferably, have a higher concentration under the thin gate dielectric portion and have a much lower concentration (maybe near substantially no implanted $V_T$ adjust dopants as you move from the thin dielectric portion to the thicker dielectric portion). This is illustrated in FIG. 4 which basically shows the $V_T$ adjust implant for a device with only a thin dielectric, only a thick dielectric, and the device of the instant invention.

The portion of the dielectric layer which is situated in the region where the thinner portion of gate dielectric 214 is to be formed is removed, the portion above where the thicker portion of gate dielectric 214 is to be formed is to remain in place, and the remainder of the dielectric layer may or may not be removed. This may be accomplished using a standard deglaze step or any other conventional dielectric removal step. After the removal step, all of the masking layer is removed and another dielectric formation step is performed. This dielectric layer is preferably comprised of the same material and is formed in the same fashion as the prior dielectric layer (preferably a thermally grown silicon dioxide layer). This dielectric layer is preferably on the order of 10 to 20 nm thick (more preferably around 15 nm thick). The result of this formation step will be a thin dielectric portion with a length, L1, and a thick dielectric portion with a length, L2. The thin dielectric portion will preferably have a thickness of around 10 to 20 nm (more preferably around 15 nm) and the thicker portions will have a thickness around 30 to 45 nm (more preferably around 30 to 42.5 nm).

The gate electrode 218 is formed by blanketly forming a layer of polycrystalline silicon (either doped in-situ or doped in a later implantation step) or other conductor (such as tungsten, tungsten nitride, tantalum, tantalum nitride, aluminum, titanium, or titanium nitride), and then patterning and etching away the excess material so as to form conductive gate structure 218. Using conventional implantation techniques, lightly doped drain (LDD) regions 211 and 212 are formed using an implant of ions at a dosage of around $1 \times 10^{13}$ to $1 \times 10^{14}$ cm$^{-3}$ with an implantation energy of around 20 to 80 keV. In this embodiment of the instant invention (i.e. an n-type LDMOS device), the dopant is phosphorous, however, for a p-type device the dopant would be comprised of boron.

Sidewall insulators 216 are formed using conventional techniques. Next, source region 208 and drain region 210 are formed using the sidewall spacers for alignment. Since the device depicted in FIG. 1 is an n-type device, for example, source region 208 and drain region 210 are doped with n+ dopants (p+ type dopants would be used for a p-type device). Preferably, source region 208 and drain region 210 are doped with arsenic or phosphorous at a dosage around $1 \times 10^{15}$ to $5 \times 10^{15}$ cm$^{-3}$ with an implant energy around 50 to 150 keV. Like other implanted regions, the dopants diffuse to some extent to form graded junctions and to diffuse the source region 208 and drain region 210 at least partially under conductive gate structure 218 during subsequent higher temperature steps (for example, thermal steps which are in excess of around 700 to 1150 C). Doped region 206 is preferably doped with a dopant type opposite that of source region 208 if it is formed at all. Preferably, doped region 206 is doped with boron at a dosage around $1 \times 10^{15}$ to $5 \times 10^{15}$ with an implant energy around 10 to 30. Doped region 206 is beneficial because it provides a connection from the backgate to the source so as to reduce the parasitic bipolar affect formed by a parasitic NPN transistor from between regions 208, 204, 210, respectively. It is important to situate region 206 as close to source region 208 so as to reduce the amount of resistance between region 204 and 206.

An important feature of this embodiment of the instant invention is that Pwell 204 extends completely under the portion of the gate structure overlying the thin portion of the gate dielectric and extends partially under the gate structure overlying the thicker gate dielectric. However, Pwell 204 does not extend to drain region 210 or even to LDD region 211. This is important because an acceptably high breakdown voltage. In addition, the $V_T$ implant situated under the portion of the gate electrode which overlies the thin gate dielectric has a higher concentration than does the other portions of the implant. This is important to have an acceptably low threshold voltage.

An equivalent circuit diagram of the device of FIG. 1a is illustrated in FIG. 1b. Device 10 illustrates the thick gate dielectric portion of the device and device 12 illustrates the thin gate dielectric portion of the device. Variable resistance 14 is shown between device 10 and drain 210. The resistance of variable resistance 14 depends on the doping of LDD 211, drain region 210, well region 204, dopant region 220 and region 202. The portion of the channel of the device looks like it has a length of (L1+L2). However, due to the doping levels of the device (more specifically, dopants 220), the effective channel is given, pretty much, by L3.

FIGS. 2a and 2b illustrate advantages of the split gate dielectric of the instant invention. FIG. 2a is a graph of $R_{sp}$, $V_T$, and breakdown voltage versus the ratio of L1/L2. As can be seen by this graph, for ratios of L1/L2 between around 0.3 to 0.6 (more preferably around 0.4 to 0.6) the threshold voltage, $V_T$, and the value of $R_{sp}$ decrease while the breakdown voltage remains fairly high. This is desired. Optimally, the device of the instant invention would have minimum values for $R_{sp}$ and $V_T$ while having a fairly high breakdown voltage. The lower values of $R_{sp}$ and $V_T$ (as compared to a device which only has a thick gate dielectric) are obtained from the thin gate dielectric portion and the tailoring of the $V_T$ implant such that the concentration of the implant is greater (preferably around $1 \times 10^{17}$ cm$^{-3}$) under the thin gate dielectric portion and lower (preferably around $1 \times 10^{16}$ cm$^{-3}$) under the thick gate dielectric portion. The greater breakdown voltages (as compared to a device which only has a thin gate dielectric portion) is achieved from having a specific proportion of the gate structure having a thicker gate dielectric.

FIG. 2b is a graph of $R_{sp}$ versus $V_{gs}$ for various values of L1/L2. This graph illustrates that for values of L1/L2 that are greater than around 0.4, the value of $R_{sp}$ remains relatively constant for differing values of $V_{gs}$.

FIG. 4 is a graph illustrated simulated doping profiles along the channel for a thin-gate dielectric LDMOS device, a thick-gate LDMOS device and the LDMOS device of the instant invention. The difference in the concentration for the thin-gate and thick gate devices is the low voltage $V_T$ adjust implant.

Basically, the transistor of this embodiment of the instant invention (as illustrated in FIGS. 1a and 1c) has the thin gate oxide completely situated over the MOS inversion channel. Whereas only part of the thick gate oxide is situated over the MOS inversion channel. In essence the transistor of the instant invention is a true step gate oxide with the change in gate oxide thick occuring directly over the channel (whose length is given as L3) over the transistor.

Referring to the embodiment of FIG. 3, MOS device 300 utilizes the same gate structure of the instant invention as that LDMOS device of FIG. 1. Like the device of FIG. 1, the following description of device 300 is provided assuming that the device is an n-type device. However, device 300 may be an n-type device or a p-type device. One of ordinary skill in the art would know based on the teachings of this application how to convert the n-type device into a p-type device. As was stated above, device 300 utilizes the gate structure of the instant invention wherein a portion of the gate dielectric is thin (preferably around 10 to 20 nm thick—more preferably around 15 nm thick) and has a length, L1, and another portion is thick (preferably around 30 to 45 nm thick more preferably around 34 to 40 nm thick) and has a length, L2.

Preferably, if device 300 is an NMOS device, substrate 202 is doped to be of either n-type or p-type and epitaxial layer 304 is formed to be a p type well. Source region 208 and drain region 210 are, preferably, implanted with n-type (such as phosphorous or arsenic) at an implant energy of around 50 to 150 keV with a dopant dosage around $1 \times 10^{15}$ to $5 \times 10^{15}$ cm$^{-3}$. LDD regions 212 and 211 are preferably formed from n-type dopants and are preferably more lightly doped than source region 208 and drain region 210. The threshold voltage implant 220 has, preferably, a greater concentration (preferably around $1 \times 10^{17}$ to $5 \times 10^{17}$ cm$^{-3}$) of dopants under the thin gate dielectric portion and a lower (preferably around $1 \times 10^{16}$ to $5 \times 10^{16}$ cm$^{-3}$), may be even graded, concentration of dopants under the thick gate dielectric portion.

Just like the LDMOS structure of the instant invention, the MOS structure of the instant is advantageous because it provides the power performance (i.e. higher breakdown voltages) of a power device while still having the performance of the faster and lower power logic devices (i.e. lower $R_{sp}$ and lower threshold voltage).

Figure 5A:
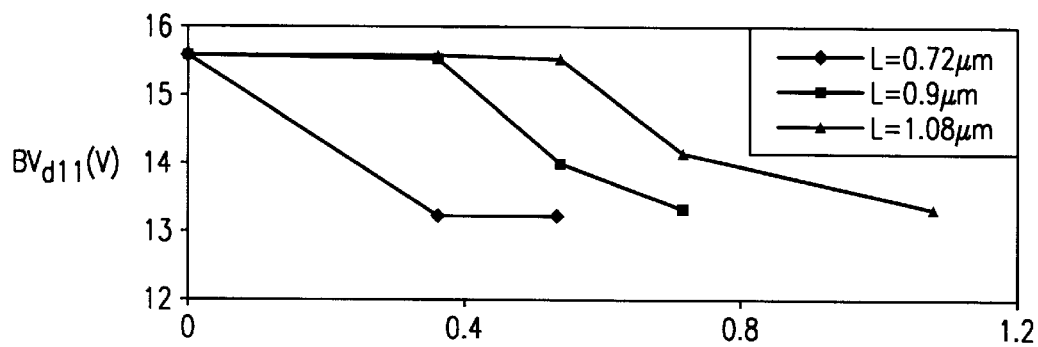
FIGS. 5a, 5b, and 5c are graphs illustrating data measured from the device of FIG. 3.
Figure 5B:
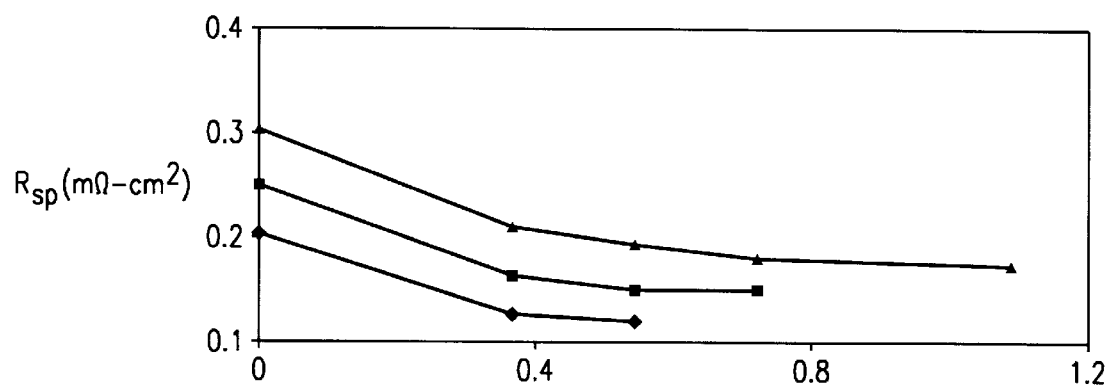
Figure 5C:
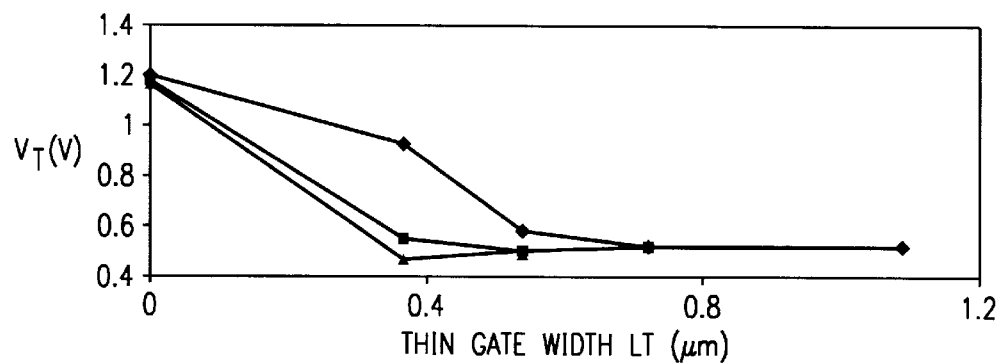

FIGS. 5a, 5b, and 5c are graphs of measured data comparing the length of the thin gate dielectric portion (L1) versus breakdown voltage, $R_{sp}$ and $V_T$, respectively. The graphs are provided for three different total gate lengths. More specifically, with a gate length of 0.72 microns, 0.9 microns, and 1.08 microns.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A transistor formed on a semiconductor substrate of a first conductivity type and having an upper surface, said transistor comprising:
    a well region formed in said semiconductor substrate, said well region of a second conductivity type opposite that of the first conductivity type;
    a source region formed in said well region in said semiconductor substrate, said source region of said first conductivity type, said source region spaced from an edge of said well region by a portion of said well having a first distance;
    a drain region formed in said semiconductor substrate and spaced away from said source region by a channel region, and spaced from said well region by a portion of said semiconductor substrate having a second distance, said drain region of said first conductivity type;
    a conductive gate electrode disposed over said semiconductor substrate and over said channel region, the conductive gate extending over the entire portion of said well having a first distance and the entire portion of said semiconductor substrate having a second distance;
    a gate insulating layer disposed between said conductive gate electrode and said semiconductor substrate and having a length, said gate insulating layer comprising:
        a first portion of said gate insulating layer which has a first length and a first thickness;
        a second portion of said gate insulating layer which has a second length and a second thickness which is substantially thicker than said first thickness, the sum of said first length and said second length equaling the length of said gate insulating layer;
        and wherein said first portion of said gate insulating layer being situated proximate to said source region and spaced away from said drain region by said second portion of said gate insulating layer;
        and said well region extends at least from source region towards said drain region so as to completely underlie said first portion of said gate insulating layer and to underlie at least said second portion of said gate insulating layer.

2. The transistor of claim 1, wherein said second thickness is around 30 to 500 nm thick.

3. The transistor of claim 1, wherein said second thickness is around 30 to 50 nm thick.

4. The transistor of claim 1, wherein said second thickness is around 34 to 45 nm thick.

5. The transistor of claim 1, wherein said first thickness is around 10 to 20 nm thick.

6. The transistor of claim 1, wherein said first thickness is around 15 nm thick.

7. The transistor of claim 1, wherein said drain region is spaced away from said well region by a second region.

8. The transistor of claim 7, wherein dopants are introduced at a first concentration into said substrate under said first portion of said gate insulating layer and are introduced into said second region at a second concentration level which is much less than said first concentration level.

9. The transistor of claim 8, wherein said dopants have a substantially higher concentration under said first portion of said gale insulating layer than said second portion of said gate insulating layer.

10. A transistor formed in a semiconductor substrate of a first conductivity type and having an upper surface, said transistor comprising:
    a well region formed at said upper surface of said semiconductor substrate and having a second conductivity type opposite that of said first conductivity type;
    a source region formed at said upper surface of said semiconductor substrate and within said well region, said source region formed of said first conductivity type and spaced from an edge of said well region by a first portion of said well region, which has a length;
    a drain region formed of said first conductivity type at said upper surface of said semiconductor substrate, said drain region spaced away from said source region by a channel region, which has a length, and spaced from said well region by a second region, which has a length;
    a conductive gate structure situated over said upper surface of said semiconductor substrate and extending substantially the entire length of said channel region, said conductive gate structure having a, substantially constant thickness across the conductive gate structure;
    a gate insulating layer situated between and abutting said upper surface of said semiconductor substrate and said conductive gate structure, said gate insulating layer comprised of:
        a first portion of said gate insulating layer which has a first length and a first thickness, said first portion of said gate insulating layer situated over a portion of said channel region and over a portion of said first portion of said well region; and;
        a second portion of said gate insulating layer which has a second length and a second thickness which is substantially thicker than said first thickness, a portion of said second portion of said gate insulating layer situated over the remainder of said first portion of said well region and the remainder of said second portion of said gate insulating layer situated over said second region;
        and wherein the ratio of said length of said first portion of said gate insulating layer and said length of said second portion of said gate insulating is around 0.4 to 0.6.

11. The transistor of claim 10, wherein the length of said channel region is equal to the summation of the length of said first portion of said well region and the length of said second region.

12. The transistor of claim 10, wherein said well region has a dopant concentration less than the dopant concentration of said source region or said drain region.

13. The transistor of claim 10, wherein said second thickness is around 30 to 500 nm thick.

14. The transistor of claim 10, wherein said second thickness is around 30 to 50 nm thick.

15. The transistor of claim 10, wherein said second thickness is around 34 to 45 nm thick.

16. The transistor of claim 10, wherein said first thickness is around 10 to 20 nm thick.

17. The transistor of claim 10, wherein said first thickness is around 15 nm thick.

* * * * *